United States Patent
Kellar et al.

(10) Patent No.: US 6,911,373 B2
(45) Date of Patent: Jun. 28, 2005

(54) ULTRA-HIGH CAPACITANCE DEVICE BASED ON NANOSTRUCTURES

(75) Inventors: Scot A. Kellar, Bend, OR (US); Sarah E. Kim, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/251,197

(22) Filed: Sep. 20, 2002

(65) Prior Publication Data

US 2004/0058504 A1 Mar. 25, 2004

(51) Int. Cl.$^7$ .............................................. H01L 21/20
(52) U.S. Cl. ........................ 438/399; 438/396; 977/1
(58) Field of Search .............................. 438/255, 398, 438/381, 396, 399

(56) References Cited

U.S. PATENT DOCUMENTS

| | | | | |
|---|---|---|---|---|
| 5,650,351 A | * | 7/1997 | Wu | 438/398 |
| 5,731,538 A | * | 3/1998 | O'Brien et al. | 102/202.5 |
| 5,742,471 A | * | 4/1998 | Barbee, Jr. et al. | 361/312 |
| 6,077,573 A | * | 6/2000 | Kim et al. | 427/578 |
| 6,271,076 B1 | * | 8/2001 | Laibowitz et al. | 438/240 |
| 6,504,292 B1 | * | 1/2003 | Choi et al. | 313/310 |
| 6,573,547 B2 | * | 6/2003 | Ahn et al. | 257/296 |
| 2003/0118738 A1 | * | 6/2003 | Shuy et al. | 427/402 |

* cited by examiner

*Primary Examiner*—Amir Zarabian
*Assistant Examiner*—Pamela E Perkins
(74) *Attorney, Agent, or Firm*—George Chen

(57) ABSTRACT

The present invention discloses a method including providing a substrate; forming a lower conductor over the substrate; forming a conducting nanostructure over the lower conductor; forming a thin dielectric over the conducting nanostructure; and forming an upper conductor over the thin dielectric.

The present invention further discloses a device including a substrate; a lower conductor located over the substrate; a conducting nanostructure located over the lower conductor; a thin dielectric located over the conducting nanostructure; and an upper conductor located over the thin dielectric.

5 Claims, 2 Drawing Sheets

ULTRA-HIGH CAPACITANCE DEVICE BASED ON NANOSTRUCTURES

BACKGROUND OF THE INVENTION

1. Field of the Invention

The present invention relates to the field of semiconductor integrated circuit (IC) manufacturing, and more specifically, to a device with ultra-high capacitance and a method of forming such a device on a substrate.

2. Discussion of Related Art

A capacitor is a passive device that includes a dielectric layer sandwiched between two conducting layers which serve as the bottom electrode and the top electrode. The dielectric layer may be formed from Silicon Oxide ($SiO_2$) with a dielectric constant, k, value of about 4.5. When a capacitor is formed on a substrate that includes other devices fabricated with silicon processing, both the bottom electrode and the top electrode may be formed from polysilicon. The resulting structure on the substrate is called a silicon-insulator-silicon (SIS) capacitor.

In some cases, the top electrode of the capacitor may be formed from metal while the bottom electrode of the capacitor may be formed from polysilicon. The resulting structure on the substrate is called a metal-insulator-silicon (MIS) capacitor.

In other cases, both electrodes of the capacitor may be formed from metal. The resulting structure on the substrate is called a metal-insulator-metal (MIM) capacitor.

The space occupied on the substrate by the capacitor may have to be reduced when other devices that are fabricated with advanced design rules are also located on the same substrate. Then, the capacitance density must be increased in order to maintain the same capacitance. Capacitance density may be increased by reducing the thickness of the dielectric layer. However, tunneling current may become excessive if the dielectric layer is too thin.

Capacitance density may also be increased by selecting a material with a higher k value for the dielectric layer. However, when the capacitor is fabricated on the substrate with other devices, the high-k material used for the dielectric layer may not be compatible with the processing of the other devices. For example, when the processing temperature is elevated, diffusion and reaction may affect the stoichiometry or phase of the high-k material.

Capacitance density may also be increased by increasing the surface area at an interface between the dielectric layer and the electrode. The surface area at the interface may be increased by roughening the surface of the electrode. When an electrode is formed from polysilicon, the surface of the electrode may be increased by forming larger grains in the polysilicon. Such films are called hemispherical silicon grain (HSG) or rough surface polysilicon (RSP). However, the grains may continue to grow during thermal processing of the substrate after formation of the dielectric layer, thus changing the resistivity of the electrode.

Thus, what is needed is a device with ultra-high capacitance and a method of forming such a device on a substrate.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of increasing capacitance density by using nanostructures to increase surface area and decrease thickness. The present invention also describes a device with ultra-high capacitance based on nanostructures that may be conducting or insulating.

In one embodiment of the present invention, the device may be used as a storage capacitor in a Dynamic Random Access Memory (DRAM) cell. Even as cell size is scaled down, the storage capacitor for a DRAM cell in each generation is usually formed as a three-dimensional structure to produce a storage capacitance of about 25–70 femto-Farad per cell (fF/cell).

In another embodiment of the present invention, the device may be used as an on-chip decoupling capacitor for logic circuits, such as a microprocessor, to reduce noise, especially at high frequencies.

In still another embodiment, the device may be part of a field effect transistor (FET). Gate capacitance, which is a function of gate voltage, may be about 140 picoFarads (pF) in some cases.

Figure 1A:
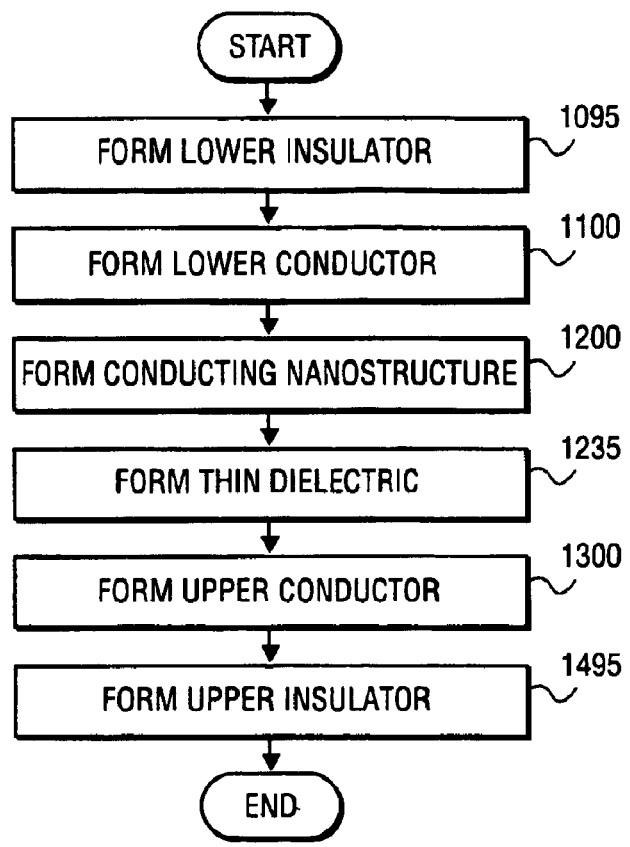
FIG. 1A is an illustration of an embodiment of a method of increasing capacitance density by using a conducting nanostructure according to the present invention.

A first embodiment of a flow diagram illustrating a method of increasing capacitance density according to the present invention is shown in FIG. 1A. An embodiment of the method starts at 1095 by forming a lower insulator on a substrate with a process, such as physical vapor deposition (PVD), chemical vapor deposition (CVD), or spin-on.

An embodiment of the method continues at 1100 by forming a lower conductor with a process, such as PVD, CVD, or electroplating. The lower conductor may serve as the lower electrode of a capacitor.

When the lower conductor is formed from polysilicon, conductivity may be increased by ion implanting or in-situ doping. When the lower conductor is formed from a metal or an alloy, conductivity may be increased by annealing to form a desired grain size. The metal or alloy may also be doped to improve its properties or characteristics.

When the lower conductor is formed from a metal or an alloy that includes Copper, a diffusion barrier layer may be formed to encapsulate the Copper. The barrier layer may be formed with ionized PVD (I-PVD), or metal-organic CVD (MOCVD).

When the lower conductor is to be formed by electroplating, a conducting seed layer may be formed to serve as a base for electroplating. The seed layer may be formed from the same or different material as the lower conductor to be formed later. The seed layer may be formed by I-PVD, CVD, atomic layer deposition (ALD), or electroless plating.

As desired, the lower conductor may be patterned with a combination of a photolithography process and an etch process. The photolithography process forms a mask for etch by applying a radiation-sensitive material, such as a photoresist, over the lower conductor to be patterned; exposing the photoresist to radiation of the appropriate wavelength and dose that has been modulated by a reticle; and developing an opening in the photoresist that corresponds to a feature on the reticle. The etch process may include dry etching to transfer the opening from the mask formed in the photoresist into the underlying lower conductor. The mask formed from the photoresist is removed after etching the underlying lower conductor.

An embodiment of the method continues at 1200 by forming a conducting nanostructure over the lower conductor. A conducting nanostructure may be formed in various ways. The choice of a suitable fabrication technique may depend on compatibility with other devices that are fabricated on the same substrate. The fabrication conditions may determine the shape, structure, and size of the conducting nanostructure. The fabrication conditions may also determine the location and orientation of the conducting nanostructure on the lower conductor.

In one embodiment, the conducting nanostructure may be formed with an electrostatic self-assembly technique. In another embodiment, the conducting nanostructure may be formed with an ionic self-assembly technique.

In still another embodiment, the conducting nanostructure may be formed with a chemical self-assembly technique. Polymer chemistry may be used to assemble the nanostructures into a highly-regular array. In one embodiment, two copolymers may be applied while in a liquid state. The surface tension of the liquid may depend on the molecular weight of the polymers. An external electric field may be applied to align the long-chain molecules in the liquid into vertical columns. The temperature may then be lowered sufficiently to harden the film, after which one component may be removed by etching, leaving an array of holes that may be filled, such as by electroplating.

In still another embodiment, the conducting nanostructure may be formed with a nano-imprint technique. In one embodiment, a polymer material may be stamped with a relief mold. The mold may be built by rastering an electron beam using direct-write e-beam equipment.

In other embodiments of the present invention, the conducting nanostructure may be formed by using an electron-beam evaporation source, a low-energy electron cyclotron resonance (ECR) plasma, molecular beam epitaxy (MBE), laser abation, vapor liquid solid (VLS) crystal growth, or arc discharge.

The conducting nanostructure should only be located in certain desired locations, such as over the lower conductor. In general, a subtractive or an additive process may be used to determine the placement of the conducting nanostructure.

In one embodiment, a subtractive process may be used to form and place the conducting nanostructure. First, the conducting nanostructure is formed non-selectively over the lower conductor using a suitable method. In one embodiment, the conducting nanostructure may be formed by self-assembly, whether electrostatic, ionic, or chemical. In another embodiment, the conducting nanostructure may be formed by CVD. Then, a combination of a lithography process and an etch process, analogous to the method discussed previously for patterning the lower conductor, may be used to remove the conducting nanostructure from the undesired locations, thus leaving the conducting nanostructure only in certain desired locations, such as over the lower conductor.

In another embodiment, an additive process may be used to form and place the conducting nanostructure. First, a material may be formed non-selectively over the lower conductor using a suitable method. In one embodiment, the material may include a catalyst, such as Nickel (Ni) or Iron (Fe). Then, a combination of a lithography process and an etch process, analogous to the method discussed previously for patterning the lower conductor, may be used to remove the catalyst from the undesired locations, thus leaving the catalyst only in certain desired locations, such as over the lower conductor. Finally, the conducting nanostructure is formed selectively over the catalyst in the desired locations. In one embodiment, the conducting nanostructure may be formed by CVD.

An embodiment of the method continues at 1235 by forming a thin dielectric over the conducting nanostructure. Good film thickness uniformity and good conformality are desired. In most cases, a particular stoichiometry of the chemical elements forming the thin dielectric is desired. In certain cases, a particular structure for the thin dielectric is also desired.

In a first embodiment, the thin dielectric may be formed at 1235 with a CVD process at a temperature selected from a range of about 350–700 degrees Centigrade. In one embodiment, a higher conformality of the thin dielectric over the conducting nanostructure may be obtained when the precursor incorporation in the CVD process is limited by the reaction rate at the surface of the conducting nanostructure rather than by mass transfer to or from the surface of the conducting nanostructure. In another embodiment, a higher conformality may be achieved when the CVD process is performed towards the lower end of the temperature range.

In a second embodiment, the thin dielectric may be formed at 1235 by using ALD, which introduces precursor gases separately so as to form one monolayer at a time by chemisorption over the conducting nanostructure. As a result, ALD may produce good film thickness uniformity and good conformality, especially for a thickness of 10 nm or less. ALD may be performed at a temperature selected from a range of about 200–400 degrees Centigrade.

In a third embodiment, the thin dielectric may be formed at 1235 by using an insulating nanostructure. The insulating nanostructure may be connected or attached to the underlying conducting nanostructure either physically or chemically. A physical attachment may involve physisorption or van der Waal's forces while a chemical attachment may involve chemisorption or covalent bonding. In one embodiment, a conducting nanostructure is first formed at 1200 over the lower conductor. Then, the thin dielectric is formed at 1235 by attaching an insulating nanostructure over the conducting nanostructure. In another embodiment (not shown), an insulating nanostructure is first attached to a conducting nanostructure to form a nanochain. Then, the nanochain is aligned so that the end with the conducting nanostructure may be attached to the lower conductor.

In a fourth embodiment, the thin dielectric may be formed at 1235 by using MOCVD. A temperature may be selected for the MOCVD from a range of about 400–500 degrees Centigrade to achieve good step coverage. The MOCVD may be followed by an anneal at a higher temperature selected from a range of about 600–900 degrees Centigrade to form the proper stoichiometry and structure so that the desired high capacitance and low leakage current may be obtained. The anneal may be oxidizing or reducing, depending on the material being used to form the thin dielectric. Any temperature that may result in an undesired phase change for the thin dielectric should be avoided.

In other embodiments, the thin dielectric may be formed at 1235 by using other processes, such as sol-gel deposition, pulsed plasma sputtering, or ion beam deposition (IBD).

Forming the thin dielectric at 1235 may include patterning with a photolithography process and an etch process, analogous to the method described previously for forming the lower conductor.

Another embodiment of the method continues at 1300 by forming an upper conductor with a process, such as PVD, CVD, or electroplating. The upper conductor may serve as the upper electrode of a capacitor. The same or different techniques may be used to form the upper conductor at 1300 and the lower conductor at 1100.

Another embodiment of the method continues at 1495 by forming an upper insulator with a process, such as PVD, CVD, or spin-on. The same or different techniques may be used to form the upper insulator at 1495 and the lower conductor at 1095.

Figure 1B:
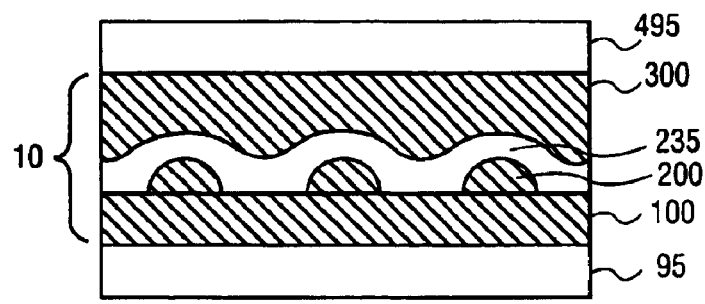
FIG. 1B is an illustration of a cross-sectional view of an embodiment of a device with ultra-high capacitance based on a conducting nanostructure according to the present invention.

A first embodiment of a capacitor structure 10 on a substrate that includes a conducting nanostructure 200 to increase capacitance density according to the present invention is shown in FIG. 1B.

The capacitor structure 10 may be located between a lower insulator 95 and an upper insulator 495. The lower insulator 95 and the upper insulator 495 may each have a thickness selected from a range of about 0.1–2.0 microns (um). The lower insulator 95 and the upper insulator 495 may include the same or different insulating materials. Insulating materials may include Silicon Oxide ($SiO_2$), Fluorine-doped Oxide (SiOF), or Carbon-doped Oxide (CDO or SiOC). In one embodiment, the insulating material may have a dielectric constant, k, with a value of 3.0 or lower.

The capacitor structure 10 may include a lower conductor 100 and an upper conductor 300 as the electrodes. The lower conductor 100 and the upper conductor 300 may include the same or different conducting materials. In one embodiment, the conducting material may include doped polysilicon with a thickness selected from a range of about 0.05–0.40 um. In another embodiment, the conducting material may include a metal or an alloy with a thickness selected from a range of about 0.30–2.50 um. The metal or alloy may include Aluminum or Copper. A capacitor structure with a metal or an alloy conductor may have a higher capacitance density than a capacitor structure with a polysilicon conductor.

A conducting material that includes Copper may require encapsulation with a barrier layer to prevent diffusion of the Copper into other materials in the substrate on which the capacitor structure 10 is located. The barrier layer may include a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), Titanium-Silicon-Nitride (TiSiN), and Tungsten-Nitride (WN). The barrier layer may have a thickness selected from a range of about 8–50 nm. In one embodiment, the barrier layer may include a bilayer with a total thickness selected from a range of about 15–35 nm.

When a conductor is to be formed by electroplating, a seed layer may be needed to serve as a base for electroplating. The seed layer and the conductors may include the same or different conducting materials. The seed layer may have a thickness selected from a range of about 50–200 nm.

When certain materials with high k value are used for the thin dielectric 235, the lower conductor 100 and the upper conductor 300 should be formed from materials that are either difficult to oxidize or that form a conductive oxide so as to avoid reducing capacitance density. In one embodiment, the lower conductor 100 and the upper conductor 300 may include certain metals, such as Iridium (Ir), Platinum (Pt), and Ruthenium (Ru).

An embodiment of the capacitor structure 10 according to the present invention may include a conducting nanostructure 200 located over the lower conductor 100. The conducting nanostructure 200 increases the surface area between the underlying lower conductor 100 and an overlying thin dielectric 235 of the capacitor structure 10. The conducting nanostructure 200 also increases the surface area between the thin dielectric 235 and the upper conductor 300 of the capacitor structure 10.

The conducting nanostructure 200 should possess high purity and uniform properties. The conducting nanostructure 200 should have few defects since defects may degrade electrical, as well as thermal and mechanical, properties. Important properties of the conducting nanostructure 200 may include electrical conductivity, thermal conductivity, and structural strength.

The conducting nanostructure 200 may include a variety of shapes, such as cylindrical, conical, tapered, hemispherical, spherical, and polygonal. The conducting nanostructure 200 may possess symmetry with respect to certain axes.

In one embodiment, the conducting nanostructure 200 may have a shape resembling a soccer ball with a lattice formed primarily from six-fold rings (hexagonal structure), with occasional five-fold rings and seven-fold rings. The lattice usually includes an even number of Carbon atoms, such as C20, C36, or C60 (Buckyball).

In another embodiment, the conducting nanostructure 200 may have a shape that resembles a pillar, a wire, or a ribbon. The conducting nanostructure 200 may have a shorter dimension and a longer dimension. The aspect ratio (shorter dimension: longer dimension) of the conducting nanostructure 200 may range from about 1:1 to about 1:300. In one embodiment, the aspect ratio may be about 1:30 to about 1:60.

The shorter dimension may include a width or a diameter. The conducting nanostructure 200 may be uniform or variable in the shorter dimension. A nanotube (NT) and a nanowire (NW) may have a uniform, cylindrical cross-section while a nanobelt may have a uniform, rectangular cross-section.

In the shorter dimension, some embodiments of the conducting nanostructure 200, such as a nanowire, a nanobelt, or a nanochain, may have a solid core. Another embodiment of the conducting nanostructure 200, such as a nanotube, may have a hollow core. The hollow core of the conducting nanostructure 200 may serve as a capillary, mold, or template. In one embodiment, the conducting nanostructure 200 may include an insulating nanostructure with a hollow core that has been filled with a conducting material.

A nanotube may be a single-walled nanotube (SWNT). The SWNT resembles a flat sheet that has been rolled up into a seamless cylinder. As desired, the wall thickness of the SWNT may be increased to enhance the mechanical strength and the rigidity of the SWNT. In one embodiment, the SWNT may have a wall thickness of about 6 nm and a shorter dimension of about 50 nm. In another embodiment, the SWNT may have a wall thickness of about 16 nm and a shorter dimension of about 230 nm.

A nanotube may also be a multi-walled nanotube (MWNT). The MWNT resembles stacked sheets that have been rolled up into seamless cylinders. In one embodiment, the MWNT may resemble 10–12 SWNTs that have been nested concentrically, one inside another. The parallel sheets increase electrical conductivity of the MWNT.

The longer dimension may include a length. The conducting nanostructure 200 may be uniform or variable in the longer dimension. The conducting nanostructure 200 may be straight, bent, or winding in the longer dimension. The conducting nanostructure 200 may include a segmented nanochain that alternates between portions with a larger cross-section resembling globules and other portions with a smaller cross-section resembling stems.

The conducting nanostructure 200 may include a range of sizes, such as about 0.3–1,000 nm in the shorter dimension and about 30–50,000 nm in the longer dimension. In one embodiment, the conducting nanostructure 200 may be about 5–15 nm in the shorter dimension and about 1,000–4,500 nm in the longer dimension. In another embodiment, the conducting nanostructure 200 may be about 230 nm in the shorter dimension and about 12,000 nm in the longer dimension. In still another embodiment, the conducting nanostructure 200 may be about 530 nm in the shorter dimension and about 20,000 nm in the longer dimension.

The conducting nanostructure 200 located over the lower conductor 100 may be arranged discretely or clustered into a nanorope. The original shape and structure of the conducting nanostructure 200 may be bent or distorted by other nearby conducting nanostructures.

In one embodiment, the conducting nanostructure 200 may be part of a discontinuous layer over the lower conductor 100, such that portions of the thin dielectric 235 may be in contact with the lower conductor 100. In another embodiment, the conducting nanostructure 200 may be part of a continuous layer over the lower conductor 100, such that the thin dielectric 235 is not in contact with the lower conductor 100 (not shown). In still another embodiment, the conducting nanostructure 200 may be part of a continuous layer with sufficient thickness to carry desired current so that the lower conductor 100 may not be needed (not shown).

The conducting nanostructure 200 located over the lower conductor 100 may be part of a highly irregular, random mixture or part of a highly regular, systematic array. In one embodiment, the longer dimension of the conducting nanostructure 200 is predominantly oriented to be essentially perpendicular to a surface of the lower conductor 100. In another embodiment, the longer dimension of the conducting nanostructure 200 is predominantly oriented to be essentially parallel to the surface of the lower conductor 100. The orientation of the conducting nanostructure 200 may affect the spacing between the lower conductor 100 and the upper conductor 235 in the capacitor structure 10.

A conducting nanostructure 200 may be formed from certain conducting metals, such as Iridium (Ir), Platinum (Pt), Ruthenium (Ru), and their conducting oxides. Cobalt (Co) and Gallium (Ga) are also conducting metals.

The graphite form of Carbon is a semimetal that possesses properties between a metal and a semiconductor. In one embodiment, doping with an alkali metal may affect the resistivity of a carbon nanostructure and change it from insulating to conducting to superconducting. In general, whether a Carbon nanotube is conducting or semiconducting depends on the chirality of the nanotube. Chirality is the twist in the sheet forming the wall of the nanotube. The barrier height, or band gap, depends on the chirality and the diameter of the nanotube. In one embodiment, the band gap is zero so the nanotube is metallic and conducting. In another embodiment, the band gap may be 0.3 electron volt (eV) for a nanotube with a twist angle of 12 degrees per nanometer of longer dimension. In other embodiments, the band gap may be about 1.0–2.0 eV for a nanotube with a larger twist angle.

The capacitor structure 10 may include a thin dielectric 235 located over the conducting nanostructure 200. The thin dielectric 235 must be thick enough to keep the electric field below the breakdown limit. Otherwise, problems may arise with respect to dielectric integrity, reliability, and leakage. In one embodiment, the thin dielectric 235 may have a thickness of about 8–90 nm. In another embodiment, the thin dielectric 235 may have a thickness of about 0.5–8 nm.

The thin dielectric 235 should have good film thickness uniformity and good conformality over the conducting nanostructure 200. The thin dielectric 235 may include materials, such as Silicon Nitride, with a k value of about 6.5, oxidized Nitride (ON), and oxidized Nitride/Oxide (ONO).

Other materials with higher k value may be used to increase capacitance density. In one embodiment, the thin dielectric 235 may include a binary ceramic oxide, such as Aluminum Oxide ($Al_2O_3$), with a k value of about 9, Tantalum Pentoxide ($Ta_2O_5$), with a k value of about 20–30, Titanium Oxide ($TiO_2$), Hafnium Oxide ($HfO_2$), and Zirconium Oxide ($ZrO_2$).

Some quaternary Silicates, such as Nitridated Hafnium Silicate (HfSiON) with a k value of 12–14, and some quaternary Aluminates, such as Silicon-doped Zirconium Aluminate (ZrAlSiO), may also be used.

A material with a Perovskite structure, such as Barium Strontium Titanate ($Ba_xSr_{1-x}TiO_3$ or BST), may have a very high k value of 200–500 due to strong ionic polarization. However, Perovskite materials are ternary and quaternary compounds so k value will be very sensitive to the composition.

A barrier layer may be needed to prevent the high k value material from reacting at an interface with Oxygen or another material. Some barrier layers that may be used include Silicon Nitride at a polysilicon interface and Titanium Nitride (TiN) at a metal interface. However, a barrier layer may affect the equivalent k value and the equivalent thickness of the dielectric stack, thus reducing and degrading capacitance density.

In one embodiment, the thin dielectric 235 that is located over the conducting nanostructure 200 may include an insulating nanostructure. The insulating nanostructure may be connected or attached to the underlying conducting nanostructure either physically or chemically. A physical attachment may involve physisorption or van der Waal's forces while a chemical attachment may involve chemisorption or covalent bonding.

In another embodiment, an array of nanochains is located between the lower conductor 100 and the upper conductor 300. Each nanochain includes an insulating nanostructure 235 attached to a conducting nanostructure 200. Each nanochain is oriented such that the end with the conducting nanostructure 200 may be attached to the underlying lower conductor 100 while the end with the insulating nanostructure 235 may be attached to the overlying upper conductor 300.

Figure 2A:
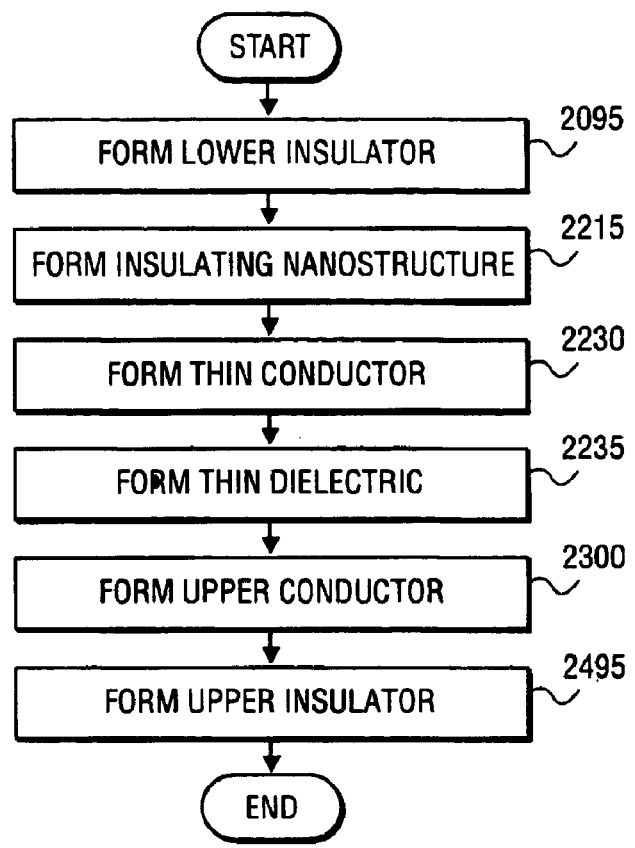
FIG. 2A is an illustration of an embodiment of a method of increasing capacitance density by using an insulating nanostructure according to the present invention.

A second embodiment of a flow diagram illustrating a method of increasing capacitance density according to the present invention is shown in FIG. 2A. An embodiment of the method includes forming a lower insulator at 2095, forming an insulating nanostructure at 2215, forming a thin conductor at 2230, forming a thin dielectric at 2235, forming an upper conductor at 2300, and forming an upper insulator at 2495. The insulating nanostructure formed at 2215 may be formed analogously to many of the methods described previously to form a conducting nanostructure.

Figure 2B:
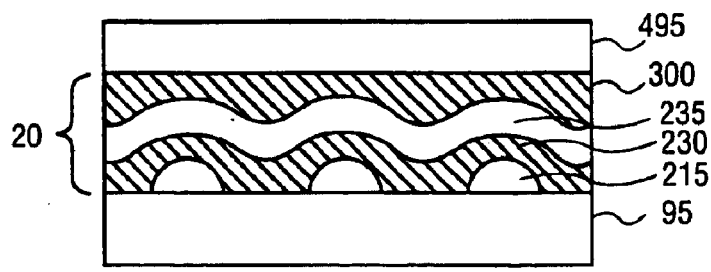
FIG. 2B is an illustration of a cross-sectional view of an embodiment of a device with ultra-high capacitance based on an insulating nanostructure according to the present invention.

A second embodiment of a capacitor structure 20 on a substrate that includes an insulating nanostructure 215 to increase capacitance density according to the present invention is shown in FIG. 2B.

An embodiment of the capacitor structure 20 is located between a lower insulator 95 and an upper insulator 495. The capacitor structure 20 includes a thin conductor 230 and an upper conductor 300 as the electrodes.

An embodiment of the capacitor structure 20 includes an insulating nanostructure 215 to increase the surface area between the thin conductor 230 and the thin dielectric 235 of the capacitor structure 20. The insulating nanostructure 215 also increases the surface area between the thin dielectric 235 and the upper conductor 300 of the capacitor structure 20.

The insulating nanostructure 215 should possess high purity and uniform properties. The insulating nanostructure 215 should also have few defects since defects may degrade electrical, as well as thermal and mechanical, properties. Important properties of the insulating nanostructure 215 may include electrical conductivity, thermal conductivity, and structural strength.

The insulating nanostructure 215 may include a variety of shapes, such as cylindrical, conical, tapered, hemispherical, spherical, or polygonal. The insulating nanostructure 215 may possess symmetry with respect to certain axes.

In one embodiment, the insulating nanostructure 215 may include a shape that resembles a pillar, a wire, or a ribbon. The insulating nanostructure 215 may have a shorter dimension and a longer dimension. The aspect ratio (shorter dimension: longer dimension) of the insulating nanostructure 215 may range from about 1:1 to about 1:300. In one embodiment, the aspect ratio may be about 1:30 to about 1:60.

The shorter dimension may include a width or a diameter. In the shorter dimension, the insulating nanostructure 215 may be uniform or variable in different embodiments. In the shorter dimension, some embodiments of the insulating nanostructure 215 may have a solid core while other embodiments may have a hollow core.

The longer dimension may include a length. In the longer dimension, the insulating nanostructure 215 may be uniform or variable in different embodiments. In the longer dimension, the insulating nanostructure 215 may be straight, bent, or winding. In one embodiment, a nanochain may be segmented, alternating between some portions that are conducting and other portions that are insulating.

The insulating nanostructure 215 may include a range of sizes, such as about 0.3–1,000 nm in the shorter dimension and about 30–50,000 nm in the longer dimension.

In one embodiment, the insulating nanostructure 215 may be part of a discontinuous layer over the lower insulator 95, such that portions of the thin conductor 230 may be in contact with the lower insulator 95. In another embodiment, the insulating nanostructure 215 may be part of a continuous layer over the lower insulator 95, such that the thin conductor 230 is not in contact with the lower insulator 95 (not shown).

The insulating nanostructure 215, located over the lower insulator 95, may be loosely arranged as discrete insulating nanostructure 215 or they may be tightly bundled into nanoropes. The orientation of the insulating nanostructure 215 located over the lower insulator 95 may vary from a highly regular, systematic array to a highly irregular, random mixture.

In one embodiment, the longer dimension of the insulating nanostructure 215 is predominantly oriented to be essentially perpendicular to the surface of the lower insulator 95. In another embodiment, the longer dimension of the insulating nanostructure 215 is predominantly oriented to be essentially parallel to the surface of the lower insulator 95. The original shape and structure of the insulating nanostructure 215 may be bent or distorted by its own weight or by the weight of other nearby insulating nanostructures.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a device with ultra-high capacitance and a method of forming such a device on a substrate.

We claim:

1. A method comprising:
   providing a substrate;
   forming an insulating nanostructure over said substrate, said insulating nanostructure being discontinuous;
   forming a thin conductor over said insulating nanostructure, said thin conductor being conformal over said insulating nanostructure and said substrate;
   forming a thin dielectric over said thin conductor; and
   forming an upper conductor over said thin dielectric.

2. The method of claim 1 wherein said insulating nanostructure is formed by self-assembly.

3. The method of claim 1 wherein said thin dielectric is formed by Atomic Layer Deposition (ALD).

4. The method of claim 1 wherein said insulating nanostructure is formed by Chemical Vapor Deposition (CVD).

5. The method of claim 1 wherein said insulating nanostructure is formed selectively.

* * * * *